(12) United States Patent
Hattori et al.

(10) Patent No.: US 7,793,174 B2
(45) Date of Patent: Sep. 7, 2010

(54) SEMICONDUCTOR APPARATUS AND TEST METHOD THEREFOR

(75) Inventors: Takashi Hattori, Kanagawa (JP); Yumiko Hashidume, Kanagawa (JP); Tatsuhiro Nishino, Kanagawa (JP); Kouji Ikeda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 506 days.

(21) Appl. No.: 11/723,140

(22) Filed: Mar. 16, 2007

(65) Prior Publication Data

US 2007/0245200 A1    Oct. 18, 2007

(30) Foreign Application Priority Data

Mar. 22, 2006    (JP)    ............................. 2006-078571

(51) Int. Cl.
*G11C 29/00*    (2006.01)
*G01R 31/28*    (2006.01)
*G01R 31/26*    (2006.01)

(52) U.S. Cl. ..................... 714/718; 714/724; 365/201; 324/765

(58) Field of Classification Search ........................ None
See application file for complete search history.

(56) References Cited

U.S. PATENT DOCUMENTS

| 5,613,075 | A * | 3/1997 | Wade et al. ................. 710/107 |
| 6,915,469 | B2 * | 7/2005 | Rajsuman ................... 714/735 |
| 6,925,018 | B2 | 8/2005 | Tatsumi |
| 7,072,824 | B2 * | 7/2006 | Halcomb et al. .............. 703/28 |
| 2002/0070726 | A1 * | 6/2002 | Sugamori ................ 324/158.1 |
| 2002/0170030 | A1 | 11/2002 | Halcomb et al. |
| 2006/0041799 | A1 * | 2/2006 | Sato ........................... 714/718 |
| 2007/0067687 | A1 * | 3/2007 | Ong ........................... 714/731 |
| 2007/0083800 | A1 * | 4/2007 | LaBerge ..................... 714/718 |
| 2007/0260965 | A1 * | 11/2007 | Schmidt et al. ............. 714/799 |

FOREIGN PATENT DOCUMENTS

| JP | 2003-77296 | 3/2003 |
| JP | 2004-158098 | 6/2004 |

OTHER PUBLICATIONS

Chinese Office Action dated May 7, 2010, with English translation.

* cited by examiner

*Primary Examiner*—Jeffrey A Gaffin
*Assistant Examiner*—Guerrier Merant
(74) *Attorney, Agent, or Firm*—McGinn IP Law Group, PLLC

(57) ABSTRACT

A SiP includes a logic chip and a memory chip. The memory chip includes a memory circuit to be tested, and the logic chip includes an internal logic circuit and a test processor electrically connected therewith. The test processor is connected with an access terminal of the memory circuit and supplies a test signal input from an external terminal to the access terminal to thereby test the memory circuit. The test processor includes a high-speed test control circuit to adjust signal delay and supplies a test signal from the external terminal to the access terminal through the high-speed test control circuit when performing high-speed test at an actual operation speed.

11 Claims, 15 Drawing Sheets

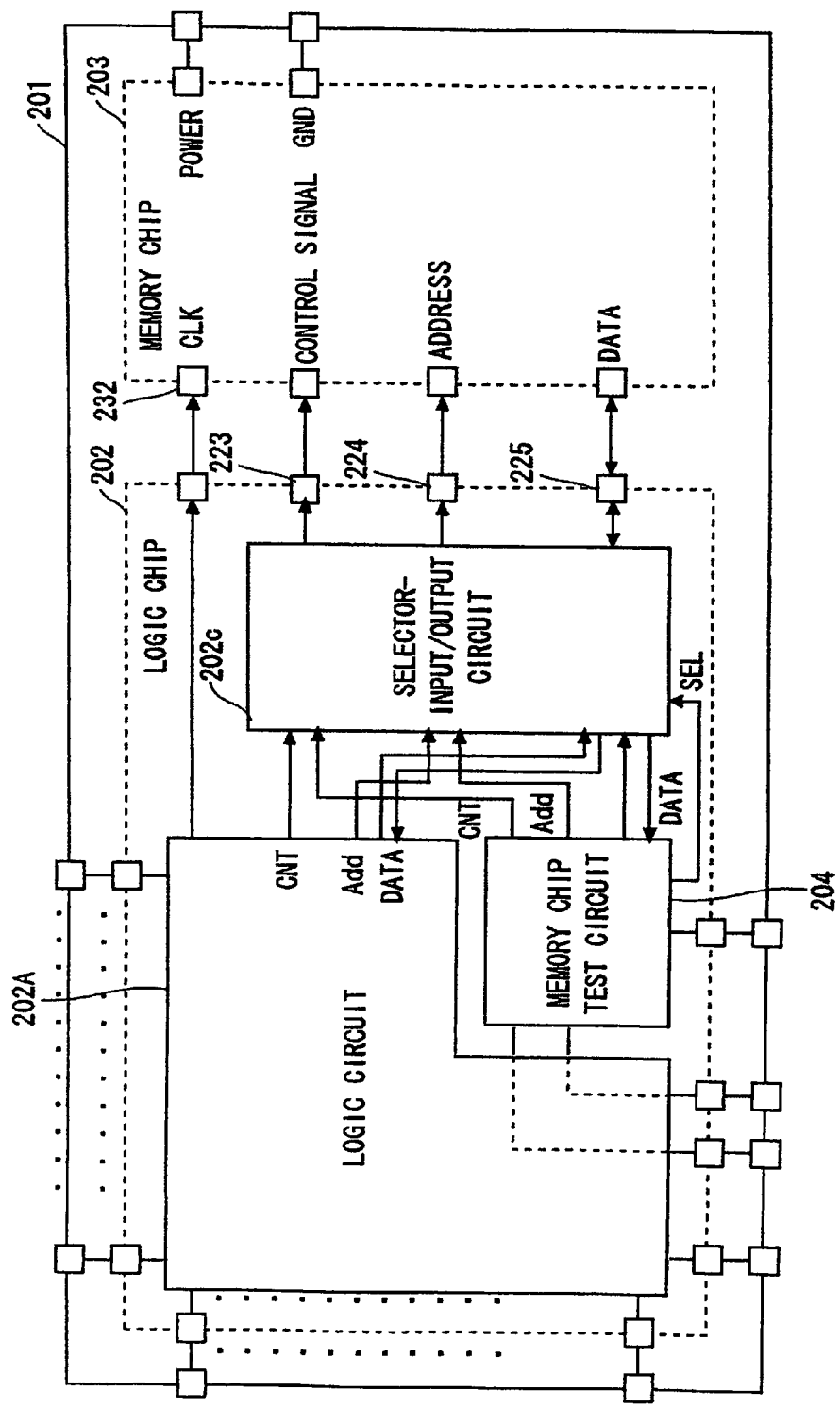
[Fig. 9] PRIOR ART

PRIOR ART
[Fig. 10]
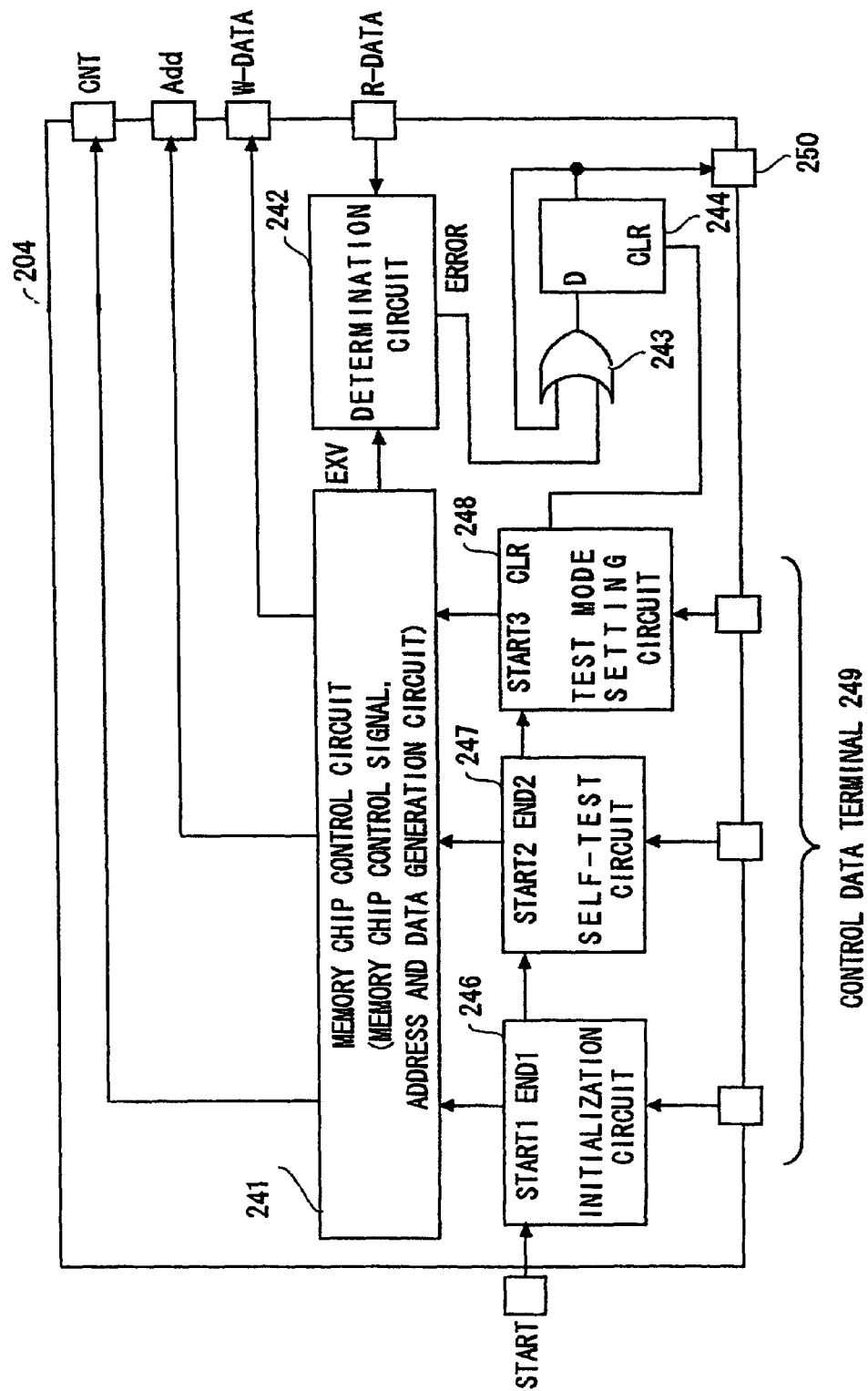

PRIOR ART
[Fig. 11]
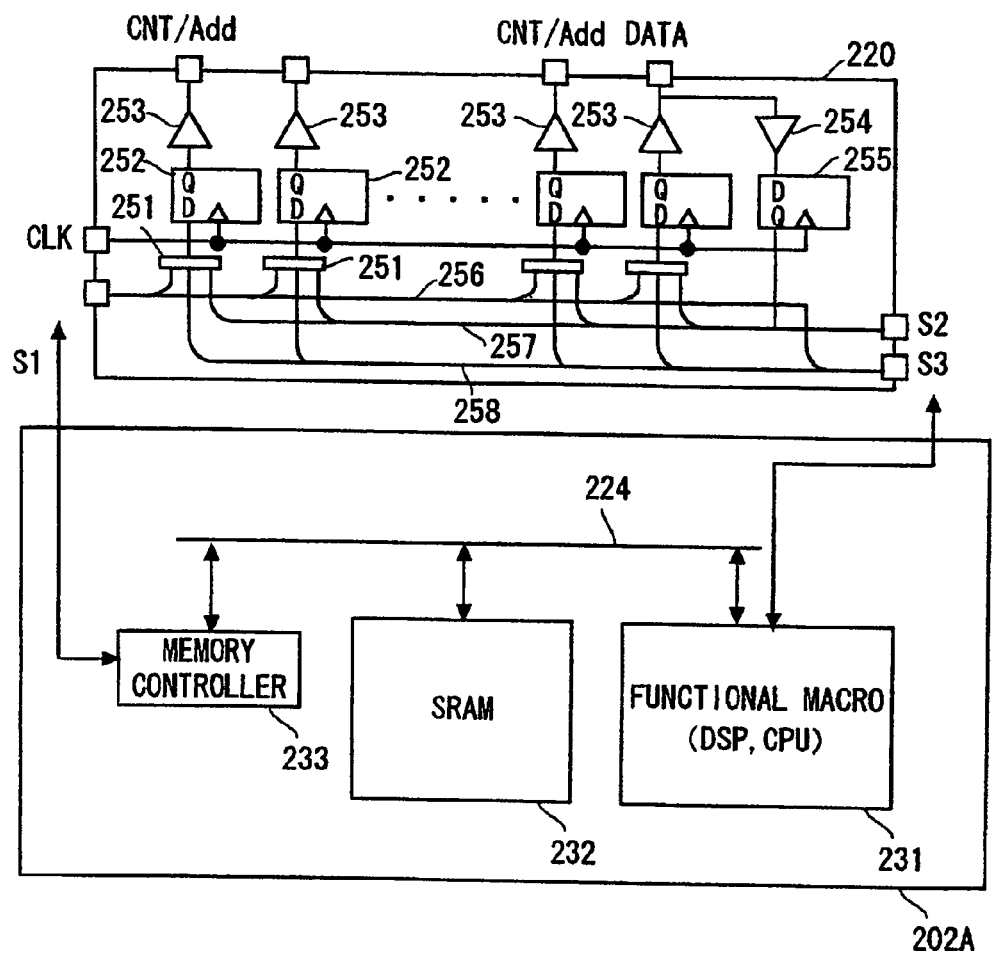

PRIOR ART
[Fig. 12]
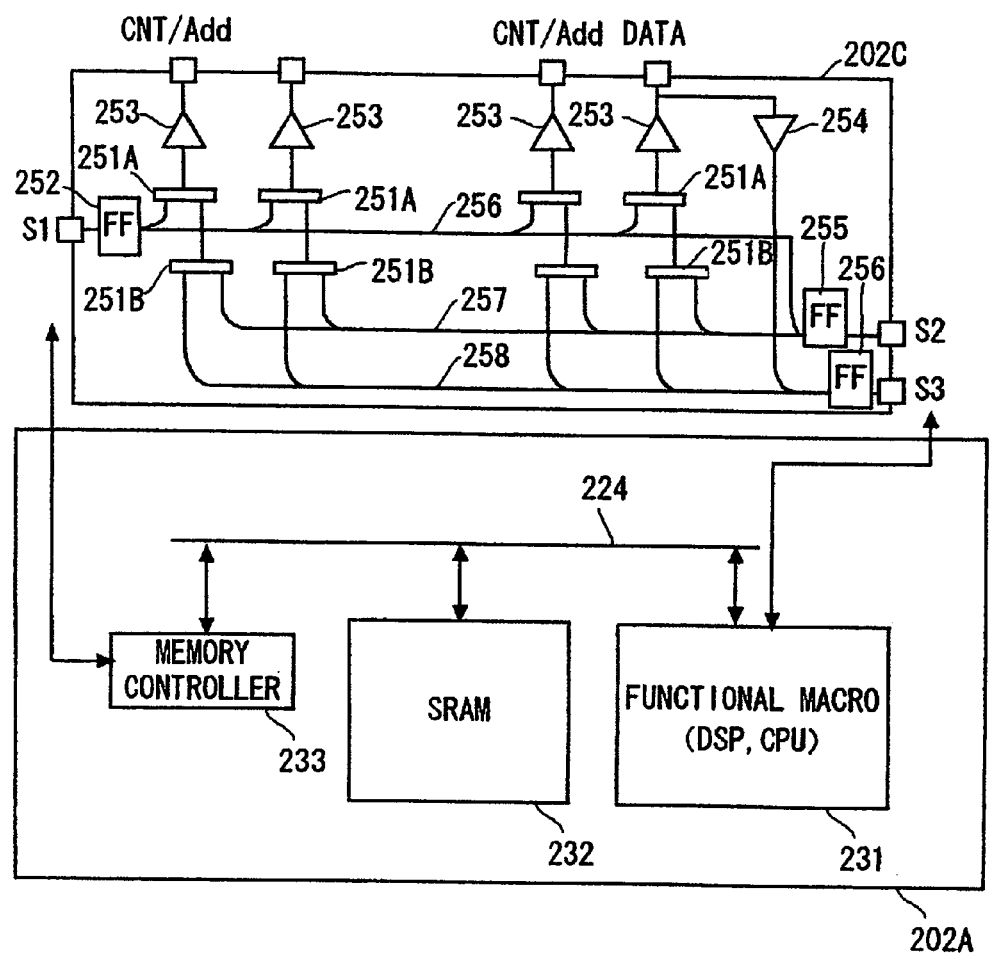

PRIOR ART
[Fig. 13]
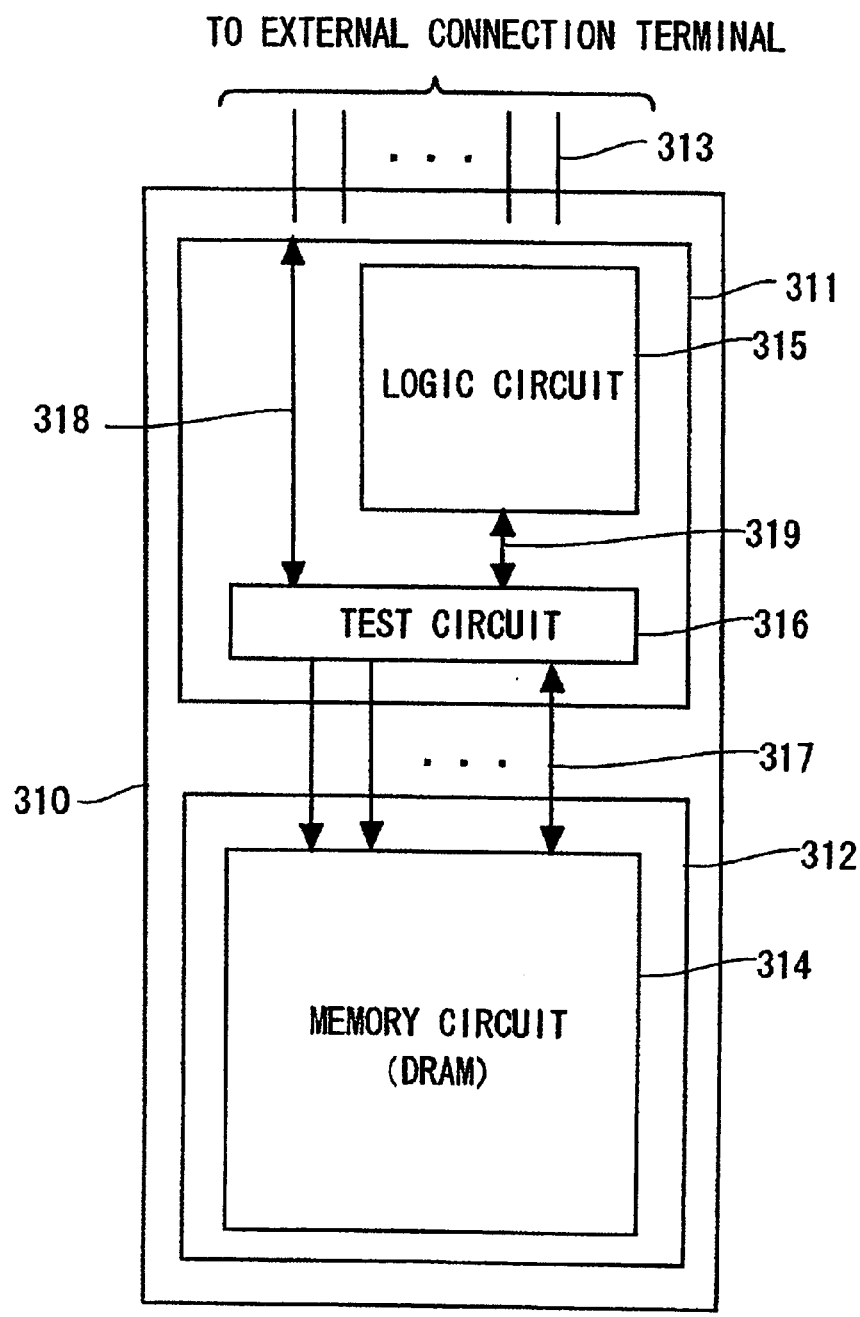

PRIOR ART
[Fig. 14]
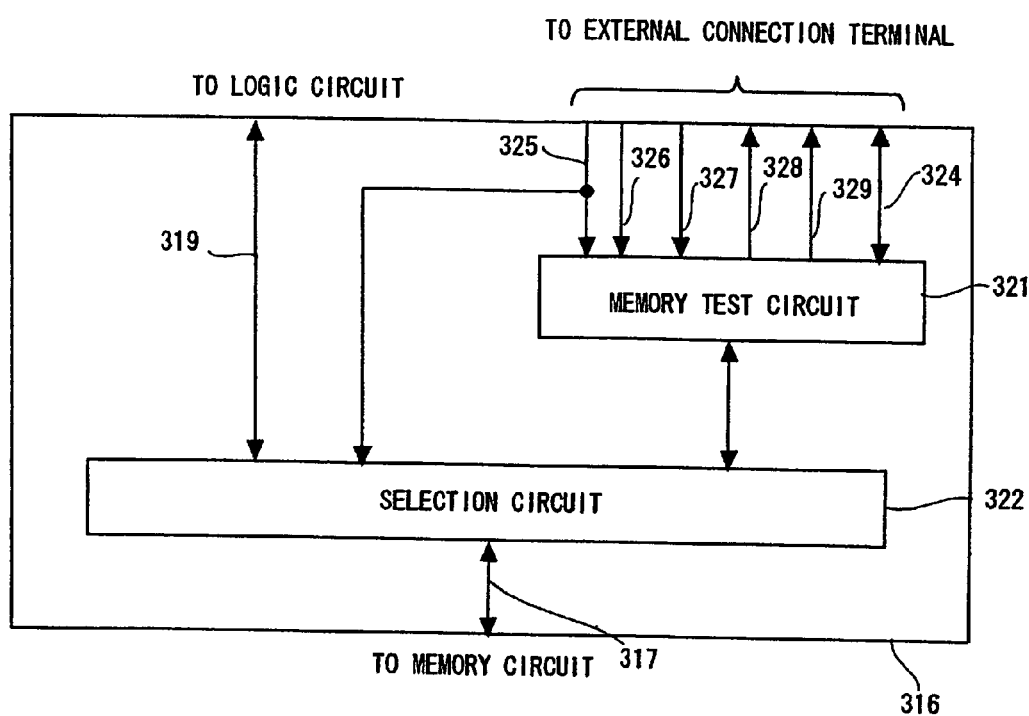

PRIOR ART
[Fig. 15]
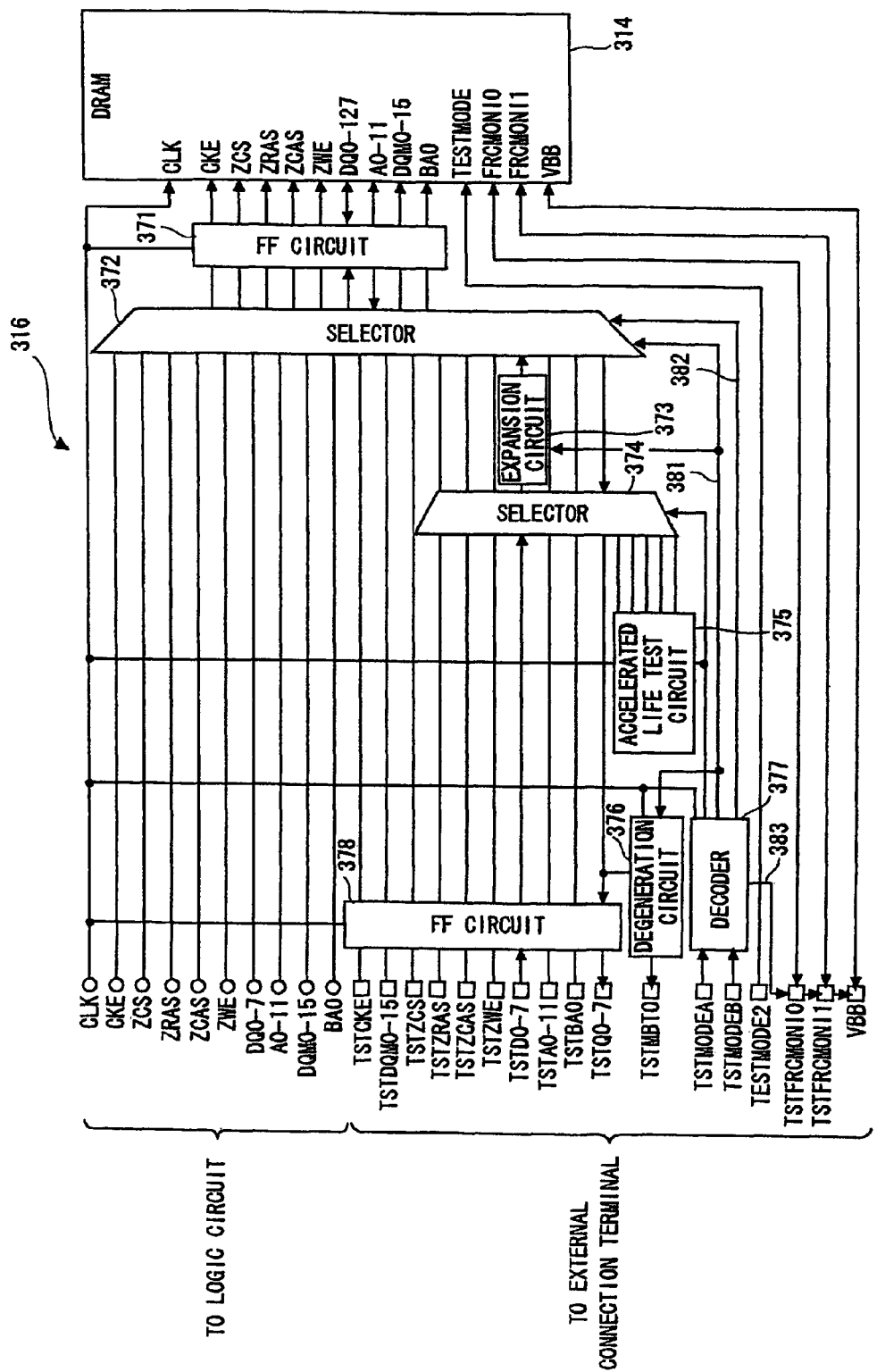

SEMICONDUCTOR APPARATUS AND TEST METHOD THEREFOR

BACKGROUND OF THE INVENTION

1. Field of the Invention

The present invention relates to a SiP (System in a Package) semiconductor apparatus that incorporates a logic chip and a memory chip into a common package and a test method for the same.

2. Description of Related Art

BIST (Built-In Self-Test) is a test method for a semiconductor apparatus that conducts self-test using a test pattern generator, a test pattern compressor, a comparator or the like placed inside a device. In the BIST, a test pattern generator generates a test pattern to be supplied to a test target circuit, a test pattern compressor compresses an output pattern from the test target circuit, and a comparator compares the compressed test pattern with an expected output pattern, thereby testing the test target circuit.

Japanese Unexamined Patent Application Publication No. 2003-77296 (Ishikawa) discloses a SiP semiconductor apparatus that incorporates a logic chip and a memory chip into a common package. The semiconductor apparatus places a memory chip test circuit (BIST circuit) and a selector-input/output circuit inside a logic chip to thereby enable testing of the memory chip by the BIST.

FIG. 9 shows the overall configuration of the semiconductor apparatus taught by Ishikawa. The semiconductor apparatus incorporates a logic chip 202 and a memory chip 203 into a common package 201. The logic chip 202 includes a logic circuit 202A, a memory chip test circuit 204, and a selector-input/output circuit 202C. The selector-input/output circuit 202C switches selection so as to activate the logic circuit 202A during normal operation and to activate the memory chip test circuit 204 during testing of the memory chip 203, so that the selected circuit accesses the memory chip 203.

A test method of the memory chip 203 is that the memory chip test circuit 204 in the logic chip 202 generates test data, address and control signals for the memory chip 203, compares write data and read data to the memory chip 203, and outputs a comparison result. Thus, the semiconductor apparatus of this related art places a BIST circuit to conduct BIST inside the logic chip 202.

FIG. 10 is an internal block diagram of the memory chip test circuit 204 shown in FIG. 9. This circuit activates an initialization circuit 246, a self-test circuit 247 and a test mode setting circuit 248 sequentially in response to a START input signal and a control data signal 249. Then, in the circuit, a memory chip control circuit 241 generates WRITE data W-DATA, address Add and a control signal CNT for the memory chip 203 and supplies these signals to the memory chip 203 to thereby perform WRITE operation. During READ operation of the memory chip 203, a determination circuit 242, an OR gate 243 and a flip-flop 244 compare READ data R-DATA output from the memory chip 203 with expected value data EXV generated in the memory chip control circuit 241 and output a comparison result through a test result signal terminal 250.

FIGS. 11 and 12 respectively show first and second exemplary internal configurations of the selector-input/output circuit 202C shown in FIG. 9. The circuit selects a memory access signal S1 from the logic circuit 202A during normal operation, a test access signal S2 from the memory chip test circuit 204 during memory chip test, and a signal S3 from a functional macro 231 during logic circuit test to thereby make an access to the memory chip 203.

Specifically, the selector-input/output circuit 202C shown in FIG. 11 includes a selector 251 to select one from the memory access signal S1, the test access signal S2 and the signal S3 from the functional macro 231, a flip-flop 252 to temporarily hold those signals, and an output buffer 253 to output the signals held in the flip-flop 252 through output terminals 223, 224 and 225. The selector 251 is configured to be capable of selecting the signal S3 from the functional macro 231 in addition to the memory access signal S1 and the test access signal S2 described above. The selector 251 selects one from the signals S1, S2 and S3 according to a select signal, which is not shown.

The selector-input/output circuit 202C also includes an input buffer 254 to input read data DATA from the memory chip 203 and a flip-flop 255 to hold the data. The output of the flip-flop 255 is supplied to the logic circuit 202A, the memory chip test circuit 204, and the functional macro 231 in the logic circuit 202A.

On the other hand, in the selector-input/output circuit 202C shown in FIG. 12, a selector is divided into a selector 251B to select one from the test access signal S2 and the signal S3 for logic circuit test and a selector 251A to select one from the signal selected by the selector 251B and an access signal S1 from the logic circuit 202A during normal operation. The output of the selector 251A is supplied directly to the output buffer 253. Further, a flip-flop 252 to temporarily hold the access signal S1 during normal operation, a flip-flop 255 to temporarily hold the test access signal S2 from the memory chip test circuit, and a flip-flop 256 to temporarily hold the signal S3 for logic circuit test in a wafer state are placed in the previous stage of the selectors 251A and 251B. An input circuit configuration is such that the output of the input buffer 254 is supplied to the flip-flops 252, 255 and 256.

In such a SiP semiconductor apparatus that incorporates a logic chip and a memory chip into a common package, a memory cell configuration (row/column configuration) of a memory chip differs by memory vendor. Further, the row/column configuration of a memory, even from the same vendor, differs if a manufacturing process (corresponding design rule) is different. It is thus difficult to test a memory chip with different row/column configuration using one BIST circuit. This causes deterioration of quality and increase in circuit size. As a technique to enable testing of a memory chip with different row/column configuration, Japanese Unexamined Patent Application Publication No. 2004-158098 (Tatsumi), for example, discloses a technique of inputting a test signal to a memory chip through an external terminal and then monitoring an output signal from the memory chip.

FIG. 13 shows a semiconductor apparatus taught by Tatsumi. As shown in FIG. 13, according to Tatsumi, a SiP semiconductor apparatus 310 includes a logic chip 311 and a memory chip 312. In the SiP semiconductor apparatus 310, the logic chip 311 includes a test circuit 316 to thereby enable testing of the memory chip 312 at relatively low speed using an external terminal.

Specifically, the logic chip 311 includes a logic circuit 315 and the test circuit 316. The logic chip 311 is directly connected with an external connection terminal through a line 313 and also connected with the memory chip 312 through a line 317. When a mode selection signal inside the external connection terminal indicates test mode, access is made from the external connection terminal to the memory circuit 314 through a line 318, the test circuit 316 and the line 317, not through the logic circuit 315. Accelerated life test and Multi-Bit Test that expands test data, writes the expanded data into the memory circuit 314 and compresses read data to thereby determine if it is defective or non-defective are performed. It is also possible to make a direct access from the external connection terminal to the memory circuit 314 through the line 318, the test circuit 316 and the line 317 to perform BIST upon power-ON or after that.

FIG. 14 is a block diagram showing a specific configuration of the test circuit 316 shown in FIG. 13. The test circuit 316 includes a memory test circuit 321 and a selection circuit 322 and uses the line 317 as a common access path to the memory circuit 314. During normal operation, an output signal from the logic circuit 315 is output to the line 317 from the line 319 through the test circuit 316. During testing, necessary test signals (324 to 329) are input to and output from the line 317 from the line 318 through the test circuit 316. The test signals involve an access control signal 324, a mode signal 325, a read/write address signal 326, a test write data signal 327, a test data signal 328, and a determination result signal 329. These signals are used to access the memory circuit 314 to thereby perform accelerated life test, Multi-Bit test and self-diagnostic test (BIST).

FIG. 15 is an example of a specific circuit configuration of the test circuit 316 shown in FIG. 14. The test circuit 316 includes flip-flops (FFs) 371 and 378, selectors 372 and 374, a decoder 377, an accelerated life test circuit 375, a degeneration circuit 376, and an expansion circuit 373. The test circuit 316 inputs/outputs signals with the logic circuit 315 and the external connection terminal. Specifically, the test circuit 316 selects by the selector 372 either the output of the logic circuit 315 (during actual operation) or the signal processed from the signal from the external connection terminal (during testing) and makes an access to the memory circuit (DRAM) 314.

In the semiconductor apparatus disclosed in Ishikawa, a logic chip includes a BIST circuit to test a memory chip as described above. It is thereby possible to test the memory chip by the BIST at an actual operation speed of the memory chip. However, it is necessary to form a BIST circuit that corresponds to the row/column configuration of the memory chip. This is because an optimal number of rows and columns of a memory, even with the same number of bits, can vary by manufacturing process (corresponding design rule), and it is thus difficult for one BIST to conform to a memory chip with a different number of rows and columns in the test that is conducted based on the number of rows and columns intended to marking test, checkerboard test or the like.

In the semiconductor apparatus disclosed in Tatsumi, a logic chip includes a test circuit to test a memory chip by receiving a test signal from an external terminal during test mode. Because a test signal is input from outside, it is possible to conduct a desired test without altering an external circuit regardless of the number of rows and columns. However, signal delay of a test signal input to a memory chip from a test data signal input terminal and signal delay of a test result signal output from the memory chip to the test data signal terminal during testing can hinder testing at an actual operation speed of the memory chip. Specifically, if a test frequency is high, it is difficult to perform high-speed testing at a desired operation frequency due to signal delay inside the logic chip.

SUMMARY OF THE INVENTION

According to one aspect of the present invention, there is provided a semiconductor apparatus including a memory chip and a logic chip. The memory chip includes a memory circuit to be tested, and the logic chip includes an internal logic circuit and a test processor electrically connected therewith. The test processor accesses the memory circuit through an external terminal to test the memory circuit. The test processor includes a high-speed test control circuit capable of selecting a signal transfer rate between the external terminal and the memory circuit according to a test speed when testing the memory circuit.

The present invention uses the high-speed test control circuit capable of selecting a signal transfer rate according to a test speed when accessing and testing the memory circuit through the external terminal. It is thereby possible to test the memory circuit by selecting a signal transfer rate according to a test speed, such as using a signal transfer rate according to high-speed test when performing high-speed test at an actual operation frequency, for example. The present invention can thus provide a semiconductor apparatus and a test method of the semiconductor apparatus capable of high-speed testing at a desired operation frequency. Accessing the memory circuit means controlling read/write operation and observing read data on the memory circuit.

BRIEF DESCRIPTION OF THE DRAWINGS

The above and other objects, advantages and features of the present invention will be more apparent from the following description taken in conjunction with the accompanying drawings, in which:

FIG. 9 is an overall view of a semiconductor apparatus disclosed in Ishikawa;

FIG. 10 is a view showing a memory chip test circuit shown in FIG. 9;

FIG. 11 is a view showing a first exemplary internal configuration of a selector-input/output circuit shown in FIG. 9;

FIG. 12 is a view showing a second exemplary internal configuration of a selector-input/output circuit shown in FIG. 9;

FIG. 13 is a view showing a semiconductor apparatus disclosed in Tatsumi;

FIG. 14 is a block diagram showing a specific configuration of a test circuit shown in FIG. 13; and FIG. 15 is a view showing a specific example of the test circuit shown in FIG. 14.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary embodiments of the present invention are described hereinafter in detail with reference to the drawings. In the following embodiments, the present invention is applied to testing of a memory chip in a SiP semiconductor apparatus.

First Embodiment

Figure 1:
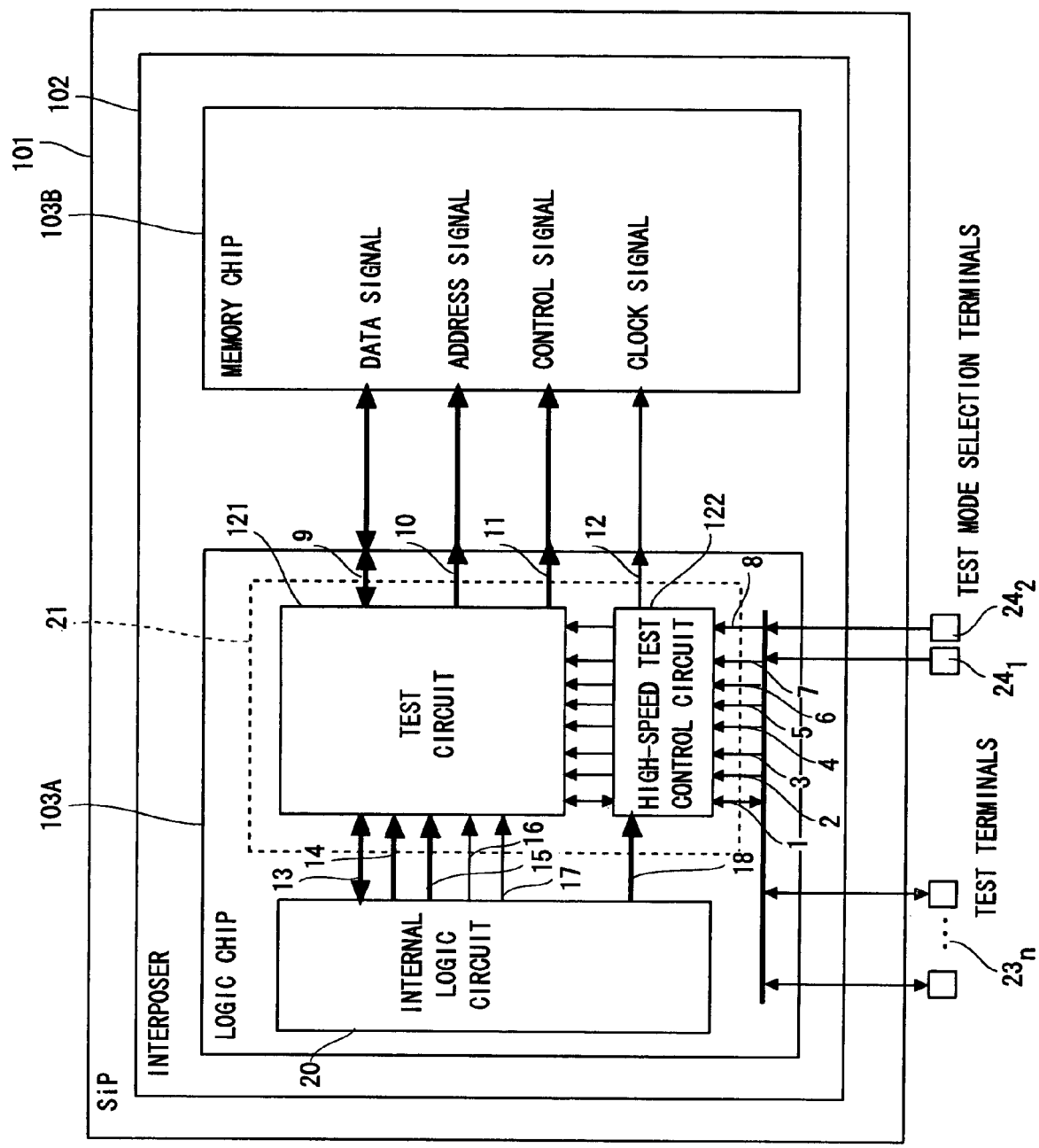
FIG. 1 is a block diagram showing a semiconductor apparatus according to a first embodiment of the present invention.

FIG. 1 is a block diagram showing a semiconductor apparatus according to a first embodiment of the present invention. A SiP semiconductor apparatus (which is referred to hereinafter as "SiP") 101 of this embodiment includes a logic chip 103A and a memory chip 103B placed on an organic substrate (interposer) 102.

The logic chip 103A includes an internal logic circuit 20 and a test processor 21 and is connected with a plurality of test terminals $23_n$ and two test mode selection terminals $24_1$ and $24_2$ as external terminals. The test terminals $23_n$ and the test mode selection terminals $24_1$ and $24_2$ may be set as either dedicated external terminals or shared external terminals in view of the number of external terminals used by a user. The logic chip 103A and the memory chip 103B are connected directly by a bump, a wire or the like, and each terminal of the memory chip 103B is not drawn as an external terminal.

The test processor 21 of this embodiment includes a test circuit 121 and a high-speed test control circuit 122. The test circuit 121 has the same functions as the test circuit 316 described in Tatsumi. The high-speed test control circuit 122 in the SiP 101 is connected with an access terminal of the memory chip 103B through the test circuit 121, and it controls read and write operation of the memory chip 103B and observes (accesses) read data of the memory chip 103B through the test terminals $23_n$ as external terminals to thereby test the memory chip 103B. The high-speed test control circuit 122 can select a signal transfer rate according to a test speed between the test terminals $23_n$ and the memory chip 103B. Specifically, the signal transfer rate between the test terminals $23_n$ and the access terminal may be a desired signal transfer rate for high-speed testing at an actual operation speed, and it may be a lower signal transfer rate than an actual operation speed for low-speed testing. Thus, the high-speed test control circuit 122 has a function to adjust the timing of a test signal in accordance with a signal transfer rate corresponding to a test speed to thereby reduce the effect of delay from a synchronization signal of the test signal as described in detail later. This reduces the difficulty of high-speed testing (actual operation speed testing) of the memory chip 103B. Further, the configuration can supply a desired test signal through the test terminals $23_n$ that are external terminals to thereby enable desired high-speed testing without altering an internal circuit regardless of the number of rows and columns of the memory chip 103B.

Figure 2:
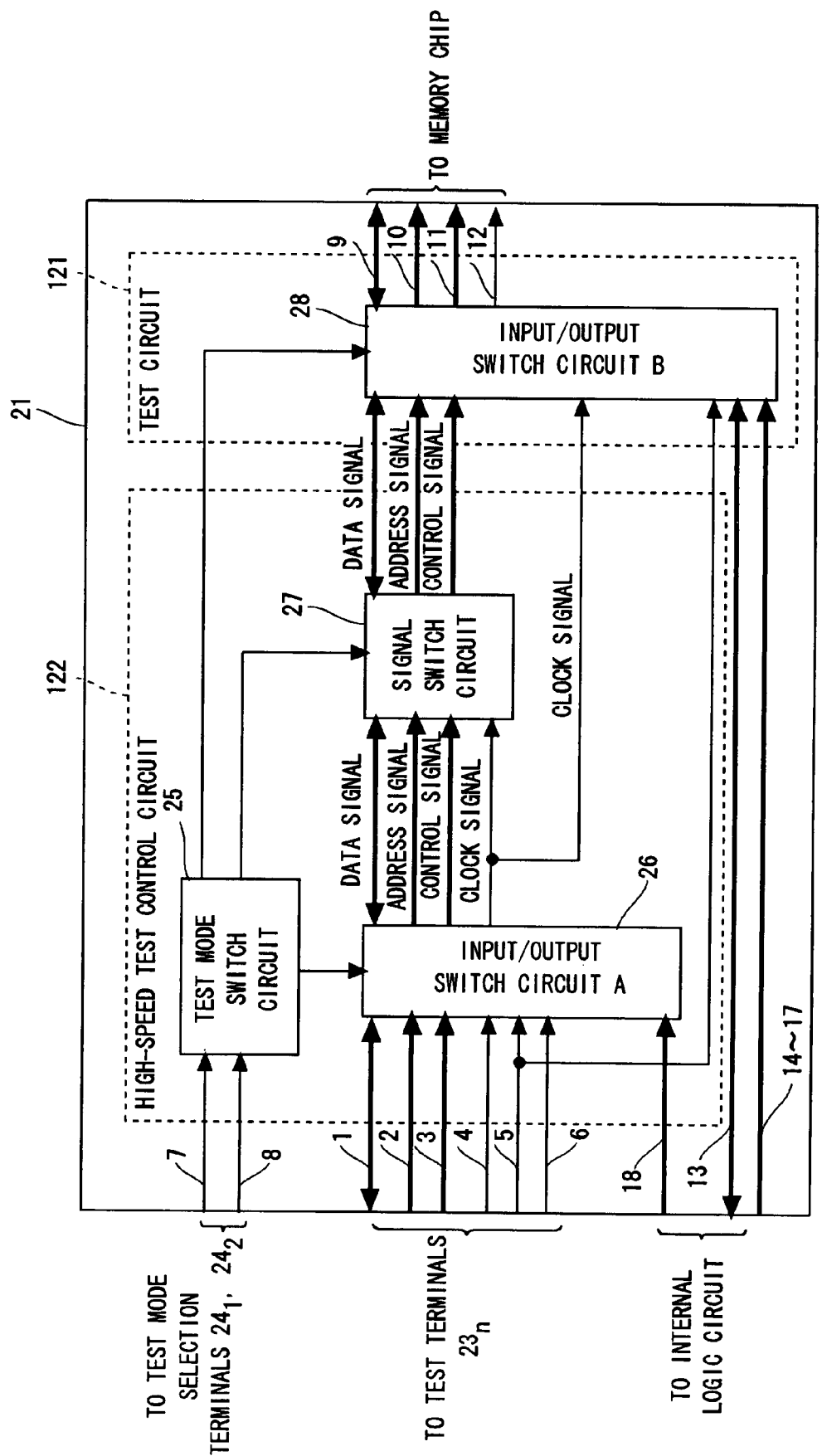
FIG. 2 is a block diagram showing a test processor in the semiconductor apparatus according to the first embodiment of the present invention.

FIG. 2 is a block diagram showing the test processor 21. The test processor 21 includes the test circuit 121 and the high-speed test control circuit 122. The test circuit 121 includes an input/output switch circuit B 28. The high-speed test control circuit 122 includes a test mode switch circuit 25, an input/output switch circuit A 26, and a signal switch circuit 27.

The test mode selection terminals $24_1$ and $24_2$ are connected with the test mode switch circuit 25 of the high-speed test control circuit 122 through lines 7 and 8. Output signals of the test mode switch circuit 25 are input to the input/output switch circuit A 26, the input/output switch circuit B 28, and the signal switch circuit 27. The test mode switch circuit 25 selects whether to perform independent test mode of the memory chip 103B or not and selects either low-speed test mode or high-speed test mode according to the signals from the test mode selection terminals $24_1$ and $24_2$ and sets the input/output switch circuit A 26, the input/output switch circuit B 28, and the signal switch circuit 27 to prescribed mode.

A data signal A, an address signal A, a control signal A, a clock signal A, and I/O control signals I1 and I2 are supplied from the test terminals $23_n$ to the input/output switch circuit A 26 through lines 1 to 6. The I/O control signal I1 is supplied also to the input/output switch circuit B 28. The input/output switch circuit A 26 disables the I/O control signal I2 during the low-speed test mode. The signal switch circuit 27 switches to enable the data signal A or the data signal B according to the I/O control signal I1. The input/output switch circuit B 28 performs WRITE/READ control of the data signal to the memory chip 103B. During the high-speed test mode, on the other hand, the signal switch circuit 27 independently switches to enable the data signal B according to the I/O control signal I1 and the data signal A according to the I/O control signal I2, and the input/output switch circuit B 28 performs WRITE/READ control of the data signal to the memory chip 103B at high speed.

The data signal, the address signal, the control signal, and the clock signal that are output signals from the input/output switch circuit A 26 are supplied to the signal switch circuit 27, and the clock signal is supplied also to the input/output switch circuit B 28. The data signal, the address signal, and the control signal that are output signals from the signal switch circuit 27 are supplied to the input/output switch circuit B 28.

Further, a data signal, an address signal, a control signal, a clock signal, and a data enable signal for actual operation are supplied from the internal logic circuit 20 to the input/output switch circuit B 28 through lines 13 to 17. A user mode signal for actual operation is supplied from the internal logic circuit 20 to the input/output switch circuit A 26 of the high-speed test control circuit 122 through a line 18.

During the test mode, the input/output switch circuit B 28 selects the data signal, the address signal, and the control signal from the signal switch circuit 27 and selects the clock from the input/output switch circuit A 26. During the actual operation mode (user mode), the input/output switch circuit B 28 selects the data signal, the address signal, the control signal, and the clock signal from the internal logic circuit 20 and supplies them to the memory chip 103B through lines 9 to 12.

Figure 3:
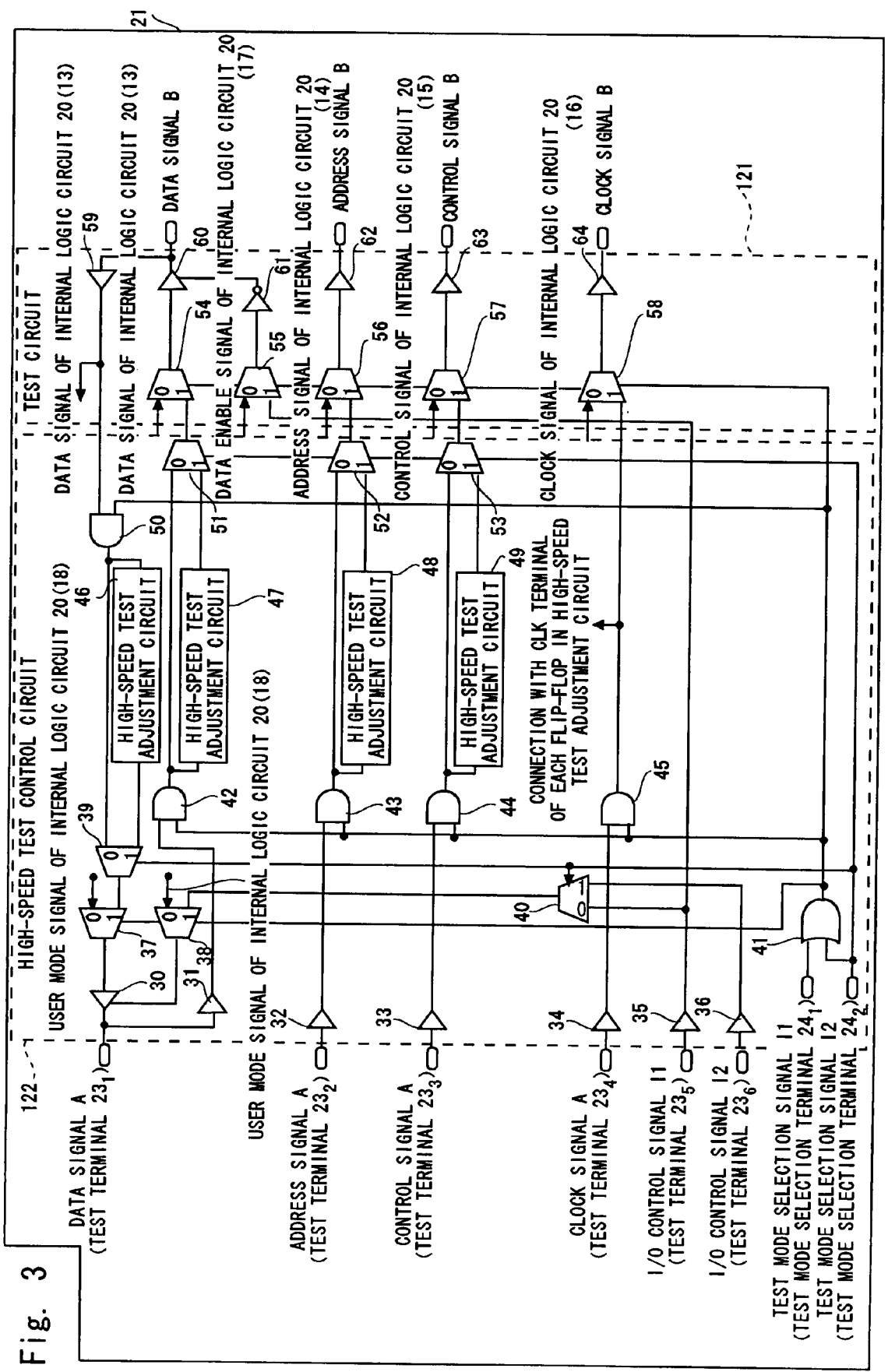
FIG. 3 is a block diagram showing a detail of the test processor in the semiconductor apparatus according to the first embodiment of the present invention.

FIG. 3 is a view showing an example of a detail of the test processor 21 shown in FIG. 2. As described above, the high-speed test control circuit 122 is connected with the test terminals $23_n$ ($23_1$ to $23_6$) as external terminals. The data signal A, the address signal A, and the control signal A are input through the test terminals $23_1$ to $23_3$. These signals are input to one input terminals of AND gates 42, 43 and 44 through buffers 31, 32 and 33, respectively. To the other input terminals of the AND gates 42, 43 and 44, output signals of an OR gate 41 to which the test mode selection signals I1 and I2 that are respectively input through the test mode selection terminals $24_1$ and $24_2$ as external terminals are input.

The output signals of the AND gates 42, 43 and 44 are directly connected with one input terminals of selectors 51, 52 and 53. To the other input terminals of the selectors 51, 52 and 53, outputs of high-speed test adjustment circuits 47, 48 and 49 are input. The selectors 51, 52 and 53 select the output signals of the AND gates 42, 43 and 44 during the low-speed test mode, and selects the output signals of the high-speed test adjustment circuits 47, 48 and 49 during the high-speed test mode. For the selection, the test mode selection signal I2 is supplied as a selection signal to the selectors 51, 52 and 53. The output signals of the selectors 51, 52 and 53 are supplied to one input terminals of selectors 54, 56 and 57. To the other input terminals of the selectors 54, 56 and 57, a signal from the internal logic circuit 20 is input. Further, an output of the OR gate 41 is supplied as a selection signal to the selectors 54, 56 and 57 so that the selectors 54, 56 and 57 selectively output the output signals of the selectors 51, 52 and 53 during the test mode, and selectively output the signal from the internal logic circuit 20 during the actual operation mode. The output signals of the selectors 54, 56 and 57 are supplied to the memory chip 103B as a data signal B, an address signal B, and a control signal B, respectively, through buffers 60, 62 and 63.

The data signal B is supplied from the memory chip 103B to one input terminal of an AND gate 50 and the internal logic circuit 20 through a buffer 59. To the other input terminal of the AND gate 50, an output signal of the OR gate 41 is supplied. An output signal of the AND gate 50 is supplied to one input terminal of a selector 39, and an output signal of a high-speed test adjustment circuit 46 is supplied to the other input terminal of the selector 39. The selector 39 selects the output signal of the AND gate 50 during the low-speed test mode and selects the output signal of the high-speed test adjustment circuit 46 during the high-speed test mode. For the selection, the test mode selection signal I2 is supplied as a selection signal to the selector 39.

An output signal of the selector 39 is supplied to one input terminal of a selector 37. The line 18 is connected with the other input terminal of the selector 37 and a user mode signal of the internal logic circuit 20 is supplied thereto. Further, an output signal of the OR gate 41 is supplied as a selection signal to the selector 37 so that the selector 37 selectively outputs the output signal of the selector 39 during the test mode and selectively outputs the user mode signal of the internal logic circuit 20 during the actual operation mode. The output of the selector 37 is output from the test terminal $23_1$ thorough a buffer 30.

The clock signal A is input through a test terminal $23_4$ as an external terminal and supplied to one input terminal of an AND gate 45 through a buffer 34. To the other input terminal of the AND gate 45, an output signal of the OR gate 41 is supplied. The output signal of the AND gate 45 serves as a clock input signal of the high-speed test adjustment circuits 46, 47, 48 and 49 and is also supplied to one input terminal of a selector 58. The other input terminal of the selector 58 is connected with the line 16 and a clock signal of the internal logic circuit 20 is supplied thereto. Further, an output signal of the OR gate 41 is supplied as a selection signal to the selector 58 so that the selector 58 selectively outputs the clock signal A from the test terminal $23_4$ during the test mode and selectively outputs the clock signal of the internal logic circuit 20 during the actual operation mode. The output of the selector 58 is output as a clock signal B to the memory chip 103B through a buffer 64.

The I/O control signals I1 and I2 are supplied from test terminals $23_5$ and $23_6$ as external terminals and input to a selector 40 through buffers 35 and 36, respectively. A test mode selection signal I2 is supplied as a selection signal to the selector 40 so that it selectively outputs the I/O control signals I1 or I2 according to the low-speed test mode and the high-speed test mode. An output of the selector 40 is connected with one input terminal of a selector 38. The other input terminal of the selector 38 is connected with the line 18, and a user mode signal of the internal logic circuit 20 is supplied thereto. Further, an output signal of the OR gate 41 is supplied as a selection signal to the selector 38 so that the selector 38 selectively outputs the output of the selector 40 during the test mode and selectively outputs the user mode signal of the internal logic circuit 20 during the actual operation mode. The output of the selector 38 serves as an enable signal for the buffer 30.

The output of the buffer 35 to which the I/O control signal I1 is supplied is connected with one input terminal of a selector 55. The other input terminal of the selector 55 is connected with the line 17 and a data enable signal of the internal logic circuit 20 is supplied thereto. An output signal of the OR gate 41 is supplied as a selection signal to the selector 55 so that the selector 55 selectively outputs the I/O control signal I1 during the test mode and selectively outputs the data enable signal of the internal logic circuit 20 during the actual operation mode. The output of the selector 55 serves as an enable signal for the buffer 60 through an inverter 61. The circuit configuration is not limited to the above-described example, and it may be arbitrary as long as desired functions are implemented.

A high-speed test adjustment circuit is described hereinafter. Prior to the description of the high-speed test adjustment circuit according to this embodiment, the operating principles are described hereinafter. Typically, delay time variations due to element characteristics fluctuation caused by PVT (Process, Voltage, Temperature) variations and an increase in delay time due to long signal lines lead to an increase in setup time of flip-flops, for example. Thus, high-speed testing is hindered by a long setup time of flip-flops due to delay time variations or increase in related arts. On the other hand, the present invention places a plurality of Retiming flip-flops as high-speed test adjustment circuits to thereby suppress the delay time variations due to element characteristics fluctuation. This enables transmission of a high-speed signal over a long distance and thus achieves high-speed testing.

Figures 4A, 4B:
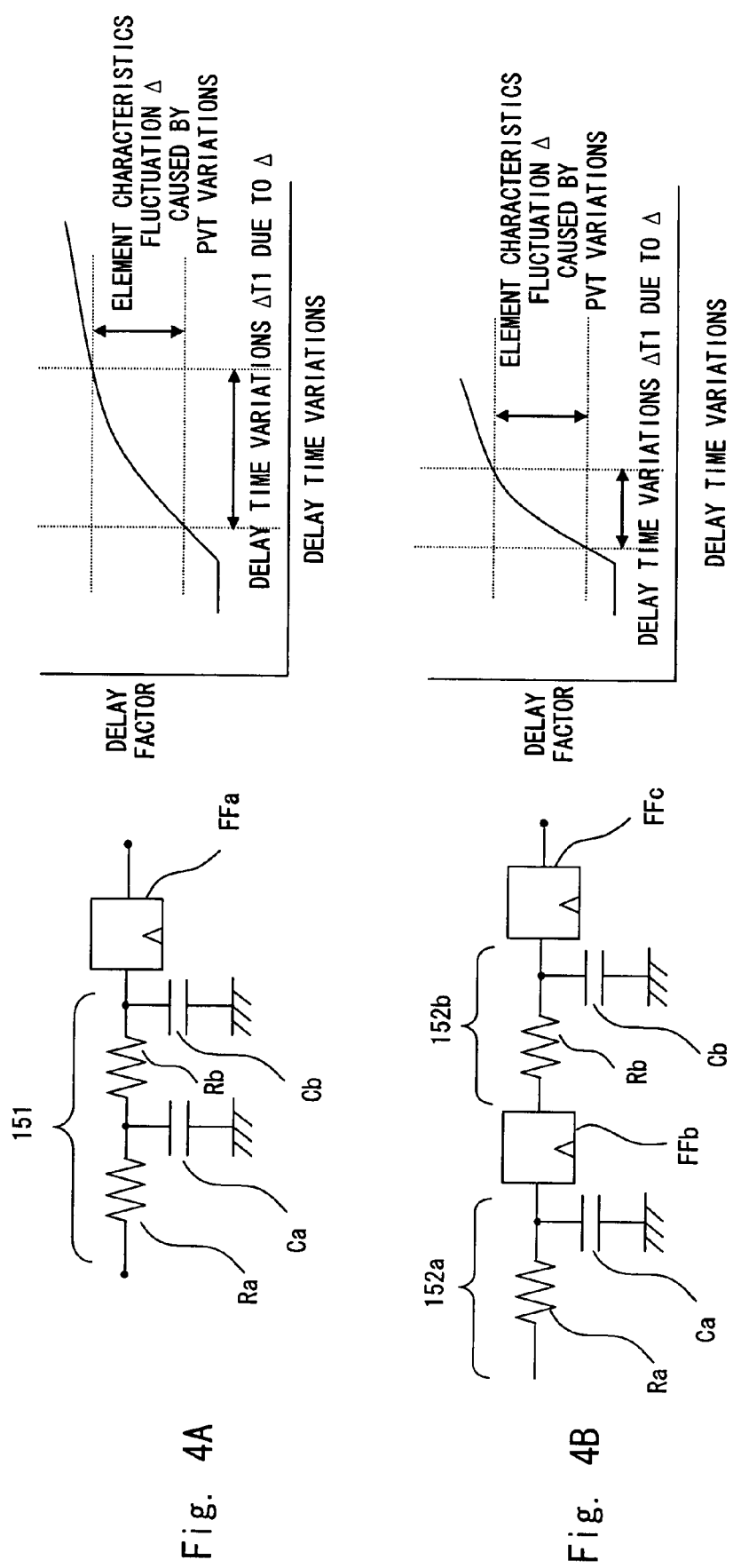
FIGS. 4A and 4B are views to describe the principles of a high-speed test adjustment circuit in the semiconductor apparatus according to the first embodiment of the present invention.

FIGS. 4A and 4B are views to describe the principles of the high-speed test adjustment circuit. As shown in FIG. 4A, a flip-flop FFa is connected with a circuit 151 that includes resistors Ra and Rb and capacitors Ca and Cb, and the element characteristics fluctuation such as threshold caused by PVT variations is A as illustrated in the right side of FIG. 4A. The delay time variations due to the threshold fluctuation Δ are indicated by ΔT1. As the values of the resistors Ra and Rb and the capacitors Ca and Cb increase, the delay time variations ΔT1 increase accordingly, which causes an increase in the setup time of the flip-flop FFa, for example, to fail to perform high-speed testing.

In FIG. 4B, on the other hand, a flip-flop FFb is placed in the middle of the circuit 151, that are indicated as circuits 152a and 152b. Although the threshold fluctuation of the circuits 152a and 152b is Δ as in FIG. 4A, the delay time variations to the flip-flops FFb and FFc are reduced to ΔT2. It is thereby possible to reduce a setup time to enable high-speed testing. This embodiment utilizes this principle and places the necessary number of Retiming flip-flops as high-speed test adjustment circuits inside the logic chip 103A, thereby suppressing the delay time variations to achieve high-speed testing. Specifically, this embodiment supplies a data signal, an address signal and a control signal, out of the test signals used for high-speed testing of the memory, to the memory through the high-speed test adjustment circuit to thereby enable high-speed testing. The clock signal used for the test is supplied to the memory without through the high-speed test adjustment circuit.

Figure 5:
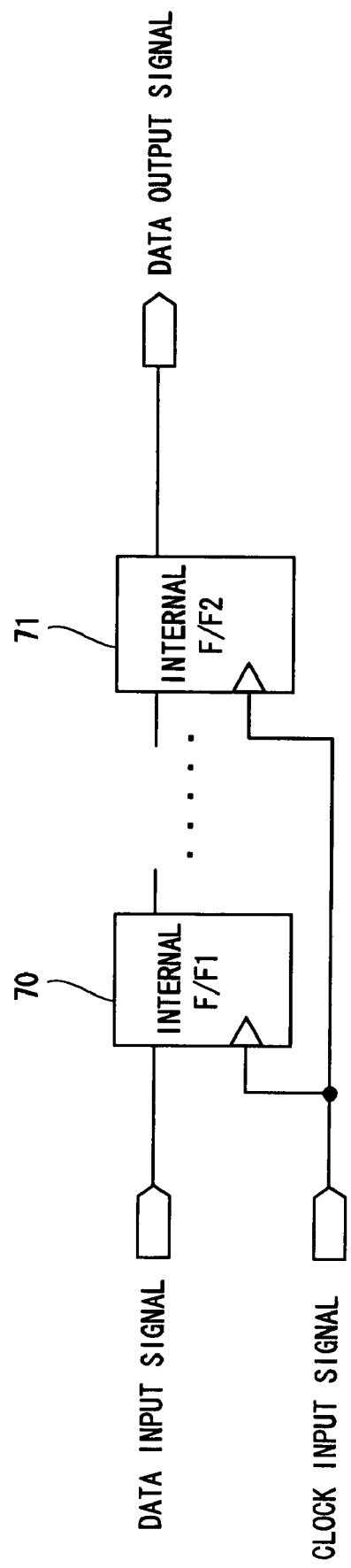
FIG. 5 is a view showing an example of a high-speed test adjustment circuit in the semiconductor apparatus according to the first embodiment of the present invention.

FIG. 5 is an example of the high-speed test adjustment circuits 46 to 49 in FIG. 3. The high-speed test adjustment circuit of this embodiment is composed of a plurality of stages of flip-flops. For simplification, FIG. 5 illustrates only two flip-flops 70 and 71. A clock input signal is supplied to each clock input of the flip-flops 70 and 71. A data input signal is input to a data input of the flip-flop 70, and an output of the flip-flop 70 is transmitted through flip-flops connected in a shift register fashion and output as a data output signal from the flip-flop 71 of the final stage. The number of stages of flip-flops may be set arbitrarily according to a desired test frequency. The high-speed test adjustment circuit absorbs timing differences due to signal delay by sequentially transferring a data signal through the flip-flops. When a signal line where a high-speed test adjustment circuit is placed is long and a test frequency is high, the large signal delay occurs; therefore, more number of stages of flip-flops can be used.

The operation of the SiP according to this embodiment is described hereinafter. The outline of a test method for the memory chip 103B is described hereinbelow. For the test processor 21 in the logic chip 103A, the actual operation mode or the independent test mode of the memory chip 103B is set through the test mode selection terminals $24_1$ and $24_2$ as external terminals and, if it is the test mode, the low-speed test mode or the high-speed test mode is set subsequently. Then, through the test terminal $23_n$ as an external terminal, the WRITE/READ operation is performed on the memory chip 103B through the logic chip 103A using a high-quality test program owned by a memory vendor so as to determine whether the memory chip 103B is defective or non-defective. There is a test program for each test item according to the low-speed testing and the high-speed testing.

The operation of the test processor 21 is described hereinbelow. Firstly, the test mode selection signal I1 and the test mode selection signal I2 are input to the test mode switch circuit 25 from the test mode selection terminals $24_1$ and $24_2$ through the lines 7 and 8, respectively, thereby setting the mode: the actual operation mode (user mode), the low-speed test mode or the high-speed test mode. The test mode switch circuit 25 sets each mode to the input/output switch circuit A 26, the signal switch circuit 27 and the input/output switch circuit B 28.

The input/output switch circuit A 26 switches the setting between the actual operation mode and the test mode according to the output signal from the test mode switch circuit 25. During the test mode of either the low-speed testing or the high-speed testing, the data signal A, the address signal A, the control signal A, and the clock signal A that are input from the test terminal $23_n$ through the lines 1 to 4 are supplied to the signal switch circuit 27 as a data signal, an address signal, a control signal, and a clock signal, respectively. Further, the input/output switch circuit A 26 switches to enable the data signal A for the low-speed testing or the high-speed testing by the I/O control signal I1 and the I/O control signal I2 that are input through the lines 5 and 6, respectively. In this embodiment, the I/O control signal I1 is used as an enable signal for the low-speed test mode, and the I/O control signal I2 is used as an enable signal for the high-speed test mode.

On the other hand, during the actual operation mode, a user mode signal is supplied to the high-speed test control circuit 122 through the line 18. For the reduction of power consumption, the data signal A, the address signal A, the control signal A, and the clock signal A are disabled internally.

The data signal, the address signal, the control signal, and the clock signal as output signals of the input/output switch circuit A 26 are input to the signal switch circuit 27. The signal switch circuit 27 outputs the data signal, the address signal and the control signal through the high-speed test adjustment circuit during the high-speed test and outputs the signals without through the high-speed test adjustment circuit during the low-speed test. The data signal, the address signal and the control signal as the output signals of the signal switch circuit 27 are input to the input/output switch circuit B 28.

During the test mode, the input/output switch circuit B 28 outputs the data signal, the address signal and the control signal output from the signal switch circuit 27 and the clock signal output from the input/output switch circuit A 26 to the memory chip 103B through the lines 9 to 12. The I/O control signal I1 input through the line 5 is used as an enable signal of the data signal B.

During the actual operation mode, the input/output switch circuit B 28 exchanges the data signal with the internal logic circuit 20 through the line 13 and receives the address signal, the control signal, the clock signal, and the data enable signal from the internal logic circuit 20 through the lines 14 to 17 and outputs them to the memory chip 103B. The data enable signal of the line 17 is used as an enable signal of the data signal B.

The test method for the memory chip 103B is described in detail hereinafter. For the test processor 21 in the logic chip 103A, the setting of the test mode and the setting of either the high-speed test mode or the low-speed test mode are made through the test mode selection terminals $24_1$ and $24_2$ as external terminals. In this embodiment, the independent test mode of the memory chip 103B can be set by turning either one or both of the test mode selection signals I1 and I2 to "H". The low-speed test mode can be set by turning the test mode selection signal I1 to "H" and the test mode selection signal I2 to "L". The high-speed test mode can be set by turning the test mode selection signal I1 to "L" or "H" and the test mode selection signal I2 to "H".

The low-speed test mode is a test mode for items to be tested at a relatively low speed (e.g. Loose Function Test, STATIC HOLD) in the high-quality test program owned by a memory vendor. In the low-speed test mode, the test processor 21 disables the I/O control signal I2 and uses the I/O control signals I1 to switch to enable the data signal A or the data signal B and performs the WRITE/READ control of the data signal to the memory chip 103B. The input signals, i.e. the data signal A, the address signal A and the control signal A, just pass through the test processor 21 in the logic chip 103A and are output directly as the data signal B, the address signal B, and the control signal B. The clock signal A is also output directly as the clock signal B, and these signals are used to perform WRITE/READ of the data signal to the memory chip 103B so as to determine if the memory chip 103B is defective or non-defective.

During the actual operation, the AND gates 42, 43, 44 and 45 shown in FIG. 3 can set both of the test mode selection signals I1 and I2 to "L" to thereby disable the input signals, i.e. the data signal A, the address signal A, the control signal A, and the clock signal A. During the low-speed test mode, a test can be performed in synchronization without using the high-speed test adjustment circuit or the like even if signal delay or the like occurs in the test processor 21 because of its low speed.

The high-speed test mode is a test mode for items to be tested at a high speed (e.g. MARCH, BANK PING-PONG) in the high-quality test program owned by a memory vendor. The test processor 21 independently switches to enable the data signal B by the I/O control signal I1 and the data signal A by the I/O control signal I2 and performs the WRITE/READ control of the data signal to the memory chip 103B at high speed. During the WRITE operation, the input signals, i.e. the data signal A, the address signal A and the control signal A, are processed through the high-speed test adjustment circuits 47, 48 and 49 in the test processor 21 of the logic chip 103A and output as the data signal B, the address signal B, and the control signal B in synchronization with the clock signal A.

The high-speed test adjustment circuits 47, 48 and 49 each include a plurality of stages of flop-flops in order to deal with a desired high-speed test frequency. According to the clock signal A described above, the data signal A, the address signal A and the control signal A, are temporarily stored into the flip-flops at a high-speed clock and then output at a next clock, thereby reducing a physical signal delay occurring in the logic chip 103A to enable high-speed writing to the memory chip 103B. Similarly, in the READ operation, the input signal of the data signal B is processed through the high-speed test adjustment circuit 46 and output as the data signal A in synchronization with the clock signal A.

As described above, this embodiment places the high-speed test adjustment circuits in the test processor 21 of the logic chip 103A to thereby perform the WRITE/READ of the data signal onto the memory chip 103B at high speed so as to determine if the memory chip 103B is defective or non-defective.

Figure 6:
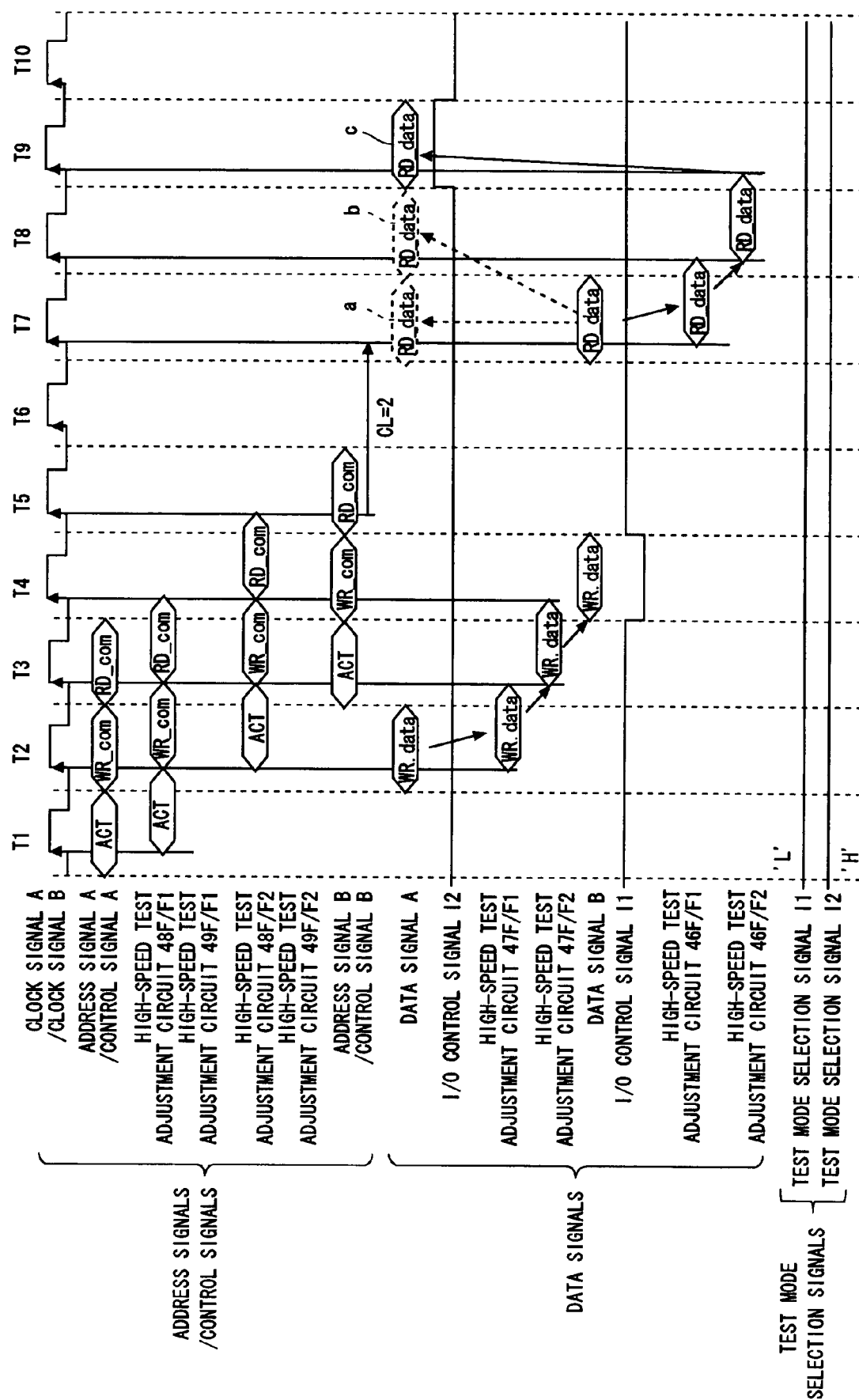
FIG. 6 is a timing chart in high-speed test mode in the semiconductor apparatus according to the first embodiment of the present invention.

FIG. 6 is a view showing a timing chart (WRITE to READ, CL=2, BL=1) during the high-speed test mode. In this example, two stages of flop-flops are included in the high-speed test adjustment circuit. The names of terminals and signals in FIG. 6 correspond to the names of the terminals and the signals of the test processor 21 shown in FIG. 3.

To enter the high-speed test mode, the test mode selection signal I1 is set to "L" (or "H") and the test mode selection signal I2 is set to "H". Then, by the address signal A and the control signal A, "ACT" command, "WRITE" command, and "READ" command are input sequentially in the cycles of T1 to T3.

By the clock signal A, the above signals are shifted for two clocks in the flip-flops F/F1 and F/F2 of the high-speed test adjustment circuits 48 and 49 and output as the address signal B and the control signal B to write each command to the memory chip 103B. In accordance with the above operation, WRITE data is input by the data signal A at the cycle T2, and the WRITE data is shifted for two clocks in the flip-flops F/F1 and F/F2 of the high-speed test adjustment circuit 47 by the clock signal A to write the WRITE data into the memory chip 103B at the cycle T4. The I/O control signal I1 is enabled by set to "L" during the WRITE period (the cycle T4) to bring the data signal B into the output mode.

It is ideal to test READ data output from the memory chip 103B in the cycle T7 at high speed, in which case it is necessary to compare READ data a during the cycle T7 with WRITE data to determine match/mismatch. In practice, however, it can be delayed to READ data b in the cycle T8 due to the effects of signal delay in the logic chip 103A or output buffer delay caused by increase in external loads, which hinders high-speed testing. To address this, this embodiment uses the high-speed test adjustment circuit 46 to temporarily store the READ data during the cycle T7 in the F/F 1 of the high-speed test adjustment circuit 46, shift the READ data in the F/F 2, and, after two clocks, output the READ data c as a data signal c shown in FIG. 6 in the cycle T9. The READ data c is compared with the WRITE data to detect if they match or mismatch to thereby perform the determination whether the memory chip 103B is defective or non-defective at high speed. In this process, the I/O control signal I2 is enabled by set to "H" during the READ period (the cycle T9) so as to bring the data signal A into the output mode. Although the high-speed testing in the READ operation on the memory chip 103B is particularly described above, the testing in the WRITE operation is performed in the same manner.

This embodiment sets the test mode on the memory chip 103B through the test mode selections terminals $24_1$ and $24_2$ and carries out the testing on the memory chip 103B through the test terminal $23_n$ using a test program owned by a memory vendor. It is thereby possible to test the memory chip 103B regardless of the row/column configuration that differs by memory vendor and manufacturing process, which affects the testing by BIST in related arts, and without the need for a BIST circuit. Further, it is possible to perform high-quality testing because the memory chip 103B can be tested at high speed using a test program owned by a memory vendor.

Further, with the use of the high-speed test adjustment circuit shown in FIG. 5 and with arbitrary change of the number of stages of flip-flops according to a desired test frequency, high-speed testing of a memory chip using external terminals, which is difficult in related arts, can be achieved.

Specifically, in FIG. 3, in some cases the chip size of the logic chip 103A may be large and the test terminals $23_n$ such as the test terminal $23_1$ (data signal A) and the input/output terminals to/from the memory chip 103B such as the data signal B terminal may be physically distant from each other due to the restrictions of the terminal position. In such a case, due to the effects of gate delay and line delay between the test terminals $23_n$ and the input/output terminals, the READ data a, which is output at the timing T7 in FIG. 6, can be output at the timing T8 or later timings in the high-speed testing. Because of such a read timing delay, it has been difficult to compare WRITE data and READ data to see if they match at a desired frequency in the high-speed testing. To address this, the embodiment places the high-speed test control circuit to thereby suppress the signal delay which occurs due to gate delay and line delay between the input/output terminals and the test terminals $23_n$.

Thus, even if the chip size of the logic chip 103A is large and the test terminals $23_n$ and the input/output terminals for the memory chip 103B are physically distant from each other due to the restrictions of the terminal position, it is possible to suppress the effects of gate delay and line delay simply by placing flip-flops in the high-speed test adjustment circuit in optimal positions in consideration of a frequency in the high-speed testing upon layout of the logic chip 103A. Further, the READ data a which is supposed to be output from the memory chip 103B at the timing T7 can be retrieved at a prescribed timing, which is at the timing T9 as the READ data c in this embodiment, with the use of the high-speed test adjustment circuit. This allows the high-speed testing at a desired frequency to be performed easily. The testing at a signal transfer rate in the actual operation is thereby achieved.

Second Embodiment

Figure 7:
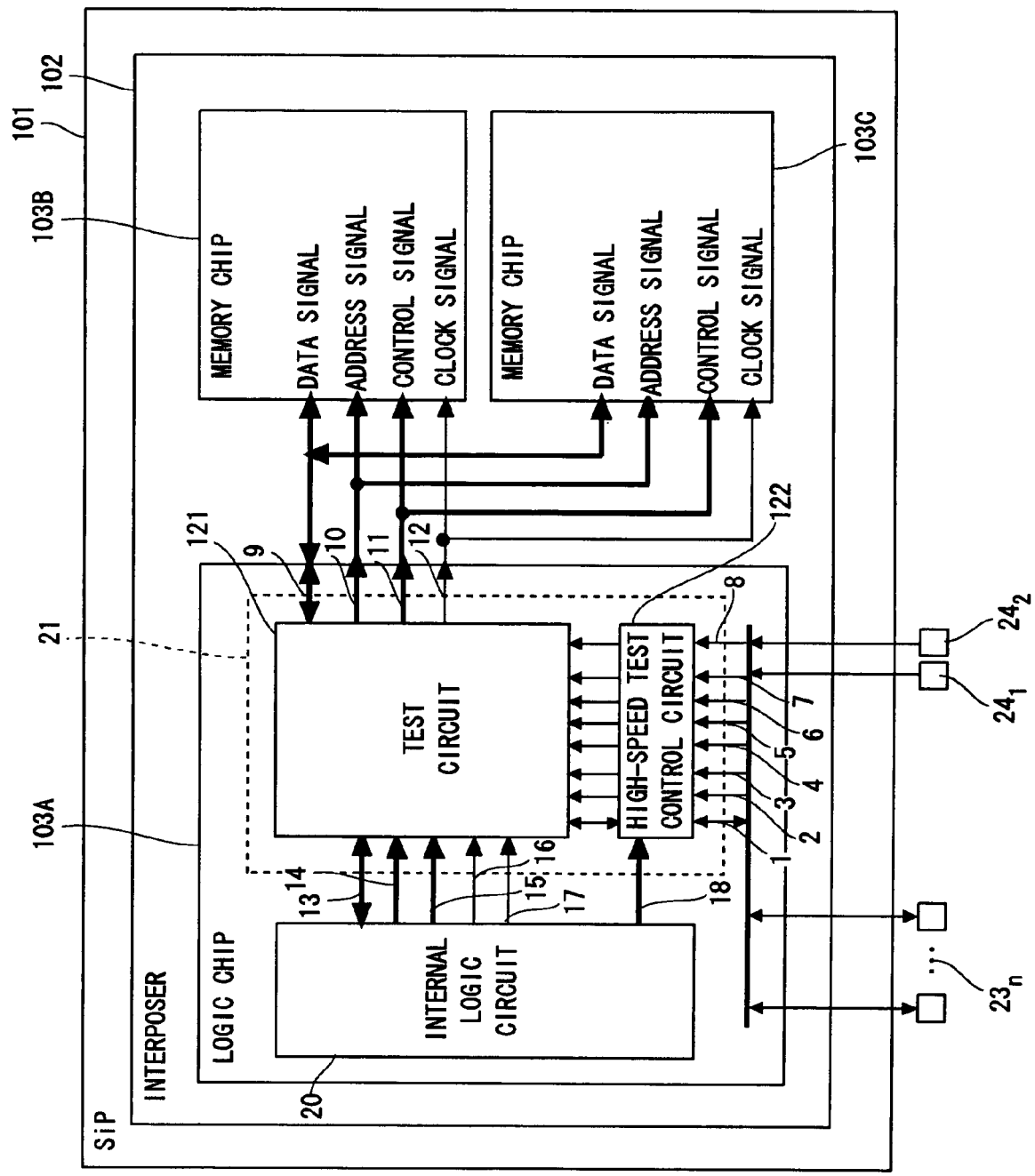
FIG. 7 is a block diagram showing a semiconductor apparatus according to a second embodiment of the present invention.

FIG. 7 is a view showing a semiconductor apparatus according to a second embodiment of the present invention. The second embodiment is different from the first embodiment shown in FIG. 1 in that two memory chips are connected with a single logic chip on the same data bus. With the two memory chips connected, it is still possible to perform high-speed testing of the memory chips 103B and 103C independently of each other simply by forming the circuit configuration that can perform READ operation independently on the memory chips 103B and 103C.

Third Embodiment

Figure 8:
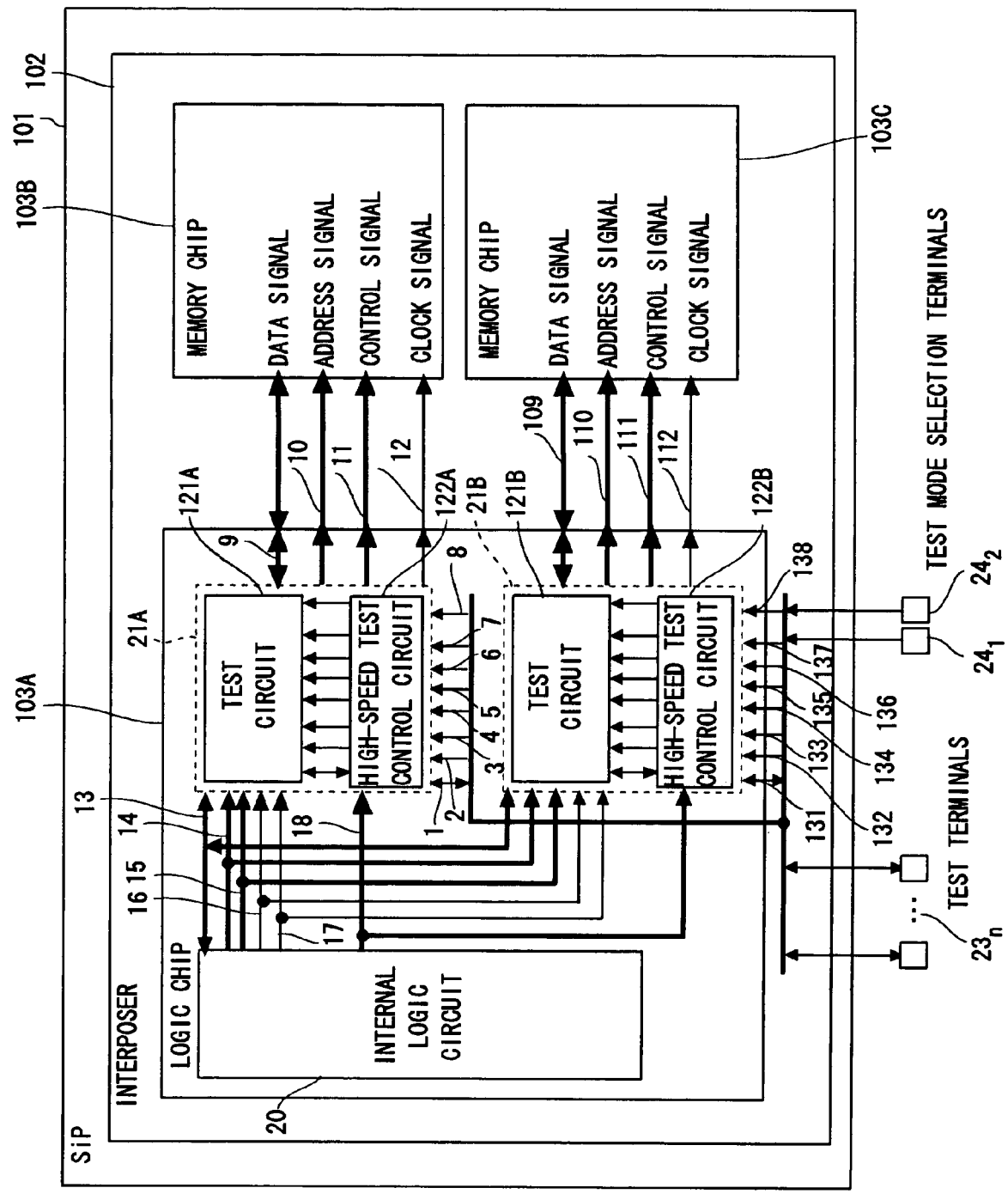
FIG. 8 is a block diagram showing a semiconductor apparatus according to a third embodiment of the present invention.

FIG. 8 is a view showing a semiconductor apparatus according to a third embodiment of the present invention. The third embodiment is different from the second embodiment shown in FIG. 7 in that two test processors 21A and 21B are placed for the two memory chips 103B and 103C so that a test circuit is connected one to one therewith. Although the memory chips 103B and 103C are tested independently of each other in the second embodiment, this embodiment enables the simultaneous high-speed testing of the memory chips 103B and 103C to thereby reduce a test time.

The present invention can thus provide a semiconductor apparatus and a test method of the semiconductor apparatus capable of high-speed testing at a desired operation frequency. Accessing the memory circuit means controlling read/write operation and observing read data on the memory circuit.

Thus, as described in the foregoing, the present invention has the following advantages:

1. It is capable of testing the memory chip without the need for BIST design and regardless of memory vendor or manufacturing process;

2. It is capable to testing the memory chip at an actual operation frequency;

3. It is capable of maintaining high-quality chip with the use of a special test program for a memory of all memory vendors;

4. It is capable of reducing a circuit size compared with a test method of a memory chip using a BIST circuit to allow smaller overhead of a circuit as a whole (for example, although a BIST circuit of a related art is about 100 Kgate, a test circuit of this embodiment can be about 2 Kgate); and 5. It is capable of reducing a package cost by eliminating the need for dedicated test external terminals.

It is apparent that the present invention is not limited to the above embodiment that may be modified and changed without departing from the scope and spirit of the invention.

What is claimed is:

1. A semiconductor apparatus comprising:
a memory chip including a memory circuit to be tested; and
a logic chip including an internal logic circuit and a test processor connected with the internal logic circuit and the memory circuit to access the memory circuit through an external terminal and test the memory circuit, the test processor including a high-speed test control circuit capable of selecting a signal transfer rate between the external terminal and the memory circuit according to a test speed when testing the memory circuit,
wherein the high-speed test control circuit includes a high-speed test adjustment circuit to set the signal transfer rate to a desired signal transfer rate when the test processor performs high-speed test at an actual operation speed, and
wherein the high-speed test adjustment circuit includes a plurality of stages of flip-flops which passes through a test signal between the memory chip and the logic chip.

2. The semiconductor apparatus according to claim 1, wherein the high-speed test control circuit selects a lower signal transfer rate than an actual operation speed when the test processor performs low-speed test at a lower speed than an actual operation speed.

3. The semiconductor apparatus according to claim 2, wherein the test processor comprises a first selector to receive a test signal from the external terminal at one input and a test signal through the high-speed test adjustment circuit at another input and to selectively output either one of the test signals according to a test speed selection signal to select one of high-speed test mode and low-speed test mode.

4. The semiconductor apparatus according to claim 2, wherein the test processor comprises a second selector to receive a test signal at one input and a user signal from the internal logic circuit at another input and to selectively output either one of the signals according to a mode selection signal to select one of test mode and user mode.

5. The semiconductor apparatus according to claim 1, wherein the test processor comprises a first selector to receive a test signal from the external terminal at one input and a test signal through the high-speed test adjustment circuit at another input and to selectively output either one of the test signals according to a test speed selection signal to select one of high-speed test mode and low-speed test mode.

6. The semiconductor apparatus according to claim 1, wherein the test processor comprises a second selector to receive a test signal at one input and a user signal from the internal logic circuit at another input and to selectively output either one of the signals according to a mode selection signal to select one of test mode and user mode.

7. The semiconductor apparatus according to claim 1, comprising
a plurality of memory chips connected with the logic chip, wherein the test processor of the logic chip independently tests memory circuits of the plurality of memory chips.

8. The semiconductor apparatus according to claim 1, comprising:
a plurality of test processors in the logic chip; and
a plurality of memory chips corresponding one to one with the plurality of the test processors.

9. A test method of a semiconductor apparatus comprising:
supplying a test signal from an external terminal through a high-speed test control circuit included in a test processor connected with an internal logic circuit on a logic chip and capable of selecting a signal transfer rate between the external terminal and a memory circuit to be tested on a memory chip according to a test speed; and
performing test on the memory circuit.
wherein when the test processor conducts high-speed test at an actual operation speed, the high-speed test is performed using a high-speed test adjustment circuit in the high-speed test control circuit by setting the signal transfer rate between the external terminal and the memory circuit to a desired signal transfer rate, by passing through the test signal in a plurality of stages of flip-flops in the high-speed test adjustment circuit.

10. The test method of a semiconductor apparatus according to claim 9, wherein
when the test processor conducts low-speed test at a lower speed than an actual operation speed, the low-speed test is performed by the high-speed test control circuit by setting the signal transfer rate between the external terminal and the memory circuit to a lower signal transfer rate than the actual operation speed.

11. A semiconductor apparatus, comprising:

a memory chip;

a test terminal which receives a first signal including a data signal, an address signal, a control signal and a clock signal in a test mode;

a logic circuit which outputs a second signal including a data signal, an address signal, a control signal and a clock signal in a user mode;

a first gate which transfers the first signal in the test mode;

a high test adjustment circuit which includes at least one flip-flop to latch the data signal, the address signal and the control signal of the first signal and output a latched signal latched in the flip-flop in response to the clock signal outputted from the first gate in the test mode;

a second gate which outputs an output of the first gate without intervening the high test adjustment circuit in a first test state of the test mode, and outputs the latched signal in a second test state of the test mode;

a third gate which transfers the first signal between the logic circuit and the memory chip in the user mode, and transfers an output of the second gate to the memory chip in the test mode, said third gate outputting the clock signal of the first signal and the clock signal of the second signal, without intervening the high test adjustment circuit, respectively in the user mode and the test mode.

* * * * *